United States Patent
Carfore (10) Patent No.: US 11,913,988 B2
(45) Date of Patent: Feb. 27, 2024

(54) TRANSDUCER BUILT-IN SELF-TEST

(71) Applicant: Qualcomm Technologies Inc., San Diego, CA (US)

(72) Inventor: Michael Carfore, North Quincy, MA (US)

(73) Assignee: QUALCOMM Technologies, Inc., San Diego, CA (US)

( * ) Notice: Subject to any disclaimer, the term of this patent is extended or adjusted under 35 U.S.C. 154(b) by 0 days.

(21) Appl. No.: 17/741,246

(22) Filed: May 10, 2022

(65) Prior Publication Data

US 2022/0365128 A1 Nov. 17, 2022

Related U.S. Application Data

(60) Provisional application No. 63/186,453, filed on May 10, 2021.

(51) Int. Cl.

| | |
|---|---|
| *G01R 27/28* | (2006.01) |
| *G01R 31/28* | (2006.01) |
| *G01R 27/32* | (2006.01) |
| *G01R 27/02* | (2006.01) |
| *H04B 3/46* | (2015.01) |
| *H04B 17/391* | (2015.01) |
| *H04B 3/40* | (2006.01) |

(52) U.S. Cl.
CPC ......... *G01R 31/2851* (2013.01); *G01R 27/02* (2013.01); *G01R 27/28* (2013.01); *G01R 27/32* (2013.01); *H04B 3/40* (2013.01); *H04B 3/46* (2013.01); *H04B 17/391* (2015.01)

(58) Field of Classification Search
CPC ............ G01R 31/2851; G01R 31/2825; G01R 31/2856; G01R 31/2839; G01R 27/32; G01R 27/28; G01R 27/02; H04B 3/46; H04B 17/391; H04B 3/40
USPC ........... 324/76.11–76.83, 459, 600, 612, 615
See application file for complete search history.

(56) References Cited

U.S. PATENT DOCUMENTS

| | | | |
|---|---|---|---|
| 2008/0253229 A1* | 10/2008 | Liu ...................... | G01N 29/041 367/87 |
| 2011/0084703 A1* | 4/2011 | McCune, Jr. ...... | G01R 31/2832 324/537 |
| 2011/0267212 A1 | 11/2011 | Denison | |

(Continued)

OTHER PUBLICATIONS

Invitation of Pay Additional Fees for International Patent Application No. PCT/US22/28609 dated Aug. 4, 2022, 3 pages.

*Primary Examiner* — Raul J Rios Russo
(74) *Attorney, Agent, or Firm* — QUALCOMM Technologies, Inc.

(57) ABSTRACT

An apparatus for testing a transducer module includes a test signal generator coupled to a common-mode terminal common to a plurality of transducers, and a signal processing circuit configured to receive output signal from each of said transducers and to produce an output signal. If the transducers are well matched to one another, the output signal will have little or no output amplitude. If there is a mismatch between the transducers, however, the output signal will have an amplitude proportional to the mismatch. The amplitude of the output signal may be compared to a predetermined threshold in order to produce a mismatch output signal indicating the existence of, and/or the degree of, mismatch between the transducers.

16 Claims, 7 Drawing Sheets

(56) References Cited

U.S. PATENT DOCUMENTS

2012/0253729 A1* 10/2012 Shih .................. G01R 31/2839
702/116
2017/0205440 A1 7/2017 Zhang et al.

* cited by examiner

TRANSDUCER BUILT-IN SELF-TEST

RELATED APPLICATIONS

This application claims priority to U.S. Provisional Application No. 63/186,453, filed May 10, 2021 and titled "Built In Self-Test" and naming Michael Carfore as inventor The disclosures of each of the foregoing applications are incorporated herein, in their entireties, by reference.

TECHNICAL FIELD

Illustrative embodiments of the generally relate to sensors and, more particularly, various embodiments of the invention relate to acoustic transducers.

BACKGROUND ART

It is known in the art to create an electrical signal that is responsive to, and is proportional to, an input stimulus. For example, a transducer system may have a set of several microphone transducers that each produces a corresponding electrical signal in response to an acoustic signal applied to the transducer system. In some applications, it is desirable that the several transducers be well matched to one another.

SUMMARY OF VARIOUS EMBODIMENTS

In accordance with an illustrative embodiment, a method for testing a system includes providing a transducer module. The transducer module includes (a) a plurality of transducers 111, 112 having a common-mode terminal (which may also be referred-to a common-mode node) 113, each transducer configured to independently produce corresponding output signal, relative to the common-mode terminal, in response to a common stimulus. Such an embodiment also includes (b) a transducer output interface including a plurality of transducer output terminals, each transducer output terminal corresponding to a one of the plurality of transducers and configured to provide corresponding output signal, and (c) a transducer signal amplifier having an input interface including a plurality of amplifier input terminals, each amplifier input terminal of the plurality of amplifier input terminals operably coupled to a corresponding one of the transducer output terminals, and a transducer signal amplifier output interface configured to provide a transducer signal amplifier output signal having an amplifier output amplitude.

The method also includes injecting a conditioned alternating signal into the common mode terminal, the conditioned alternating signal being an electrical signal having an amplitude which may be referred-to as its "injected" amplitude. In some embodiments, the conditioned alternating signal is a square wave.

The method further includes determining whether the transducers are not well matched by comparing the transducer amplifier output signal to a pre-determined mismatch threshold.

In some embodiments, determining whether the transducers are not well matched includes determining that the transducers are not well matched by:
  determining that the amplifier output amplitude exceeds the pre-determined mismatch threshold.

Some embodiments further include, subsequent to comparing the amplifier output signal to a pre-determined mismatch threshold, terminating injection of the conditioned alternating signal into the common mode terminal.

In some embodiments, the pre-determined threshold is 10 percent (10%) of the injected amplitude of the conditioned alternating signal.

In some embodiments, the transducer module further includes an oscillator circuit, the oscillator circuit configured to produce the conditioned alternating signal. In some such embodiments, wherein the oscillator circuit includes: (i) a buffer amplifier having a first buffer input terminal and a second buffer input terminal, and a buffer output terminal, the buffer output terminal in electrical communication with the common mode terminal of the transducer module, and (2) a first oscillator branch including a first switch controllable into an open configuration and a closed configuration, the first switch electrically coupled between a first voltage source providing a first voltage, and the first buffer input terminal; and (iii) a second oscillator branch including a second switch controllable into an open configuration and a closed configuration, the second switch electrically coupled between a second voltage source and the second buffer input terminal, the second voltage source providing a second voltage that is less than the first voltage. Such embodiments also include a controller circuit configured to: (1) alternately close the first switch to couple the first voltage source and the first buffer input terminal and to open the first switch to isolate the first voltage source from the first buffer input terminal; and (2) alternately open the second switch to isolate the second voltage source from the first buffer input terminal and close the second switch to couple the second voltage source to the first buffer input terminal, such that the first voltage source and the second voltage source are not simultaneously coupled to the first buffer input terminal.

In some embodiments, the plurality of transducers include a first capacitive transducer having a first transducer capacitance and a second capacitive transducer having a second transducer capacitance; and the amplitude of the amplifier output signal, while the conditioned alternating signal is injected into the common mode terminal, is proportional to the difference between the first capacitance and the second capacitance.

In some embodiments, the amplifier includes a charge amplifier.

In some embodiments, the plurality of amplifier input terminals include an inverting input terminal and a non-inverting input terminal, and the charge amplifier is configured in a non-inverting mode with a feedback network coupled to the inverting terminal, and a bias resistor electrically coupled between a bias voltage source and the non-inverting terminal. In some such embodiments, the system further includes a switch electrically coupled in parallel with the bias resistor, the switch controllably configurable into an open configuration and a closed configuration, and the method further includes: (x) controlling the switch into a closed position to couple the bias voltage source to the non-inverting terminal; and (y) determining that the method for testing a system is functioning correctly by comparing the amplifier output signal to a pre-determined verification threshold and determining that the amplifier output signal exceeds the pre-determined verification threshold.

In some embodiments of the method, the plurality of amplifier input terminals include an inverting input terminal and a non-inverting input terminal, and a first transducer output is coupled to the inverting terminal, and a second transducer output is coupled to the non-inverting terminal, and the charge amplifier is configured in a differential mode with: a first feedback network electrically coupled between the amplifier output and the inverting terminal; and a second feedback network electrically coupled between the amplifier output and the non-inverting terminal; and a bias resistor electrically coupled between a bias voltage source and the non-inverting terminal; and the system also includes: a verification switch electrically coupled in parallel with the bias resistor, the verification switch controllably configurable into an open configuration and a closed configuration, and the method further includes: in a verification mode, controlling the verification switch into a closed position to couple the bias voltage source to the non-inverting terminal; and determining that the method for testing a system is functioning correctly by comparing the amplifier output signal to a pre-determined verification threshold and determining that the amplifier output signal exceeds the pre-determined verification threshold.

In some embodiments of the method, the transducer module is configured to produce an electrical signal in response to a pre-determined stimulus, and the method further includes depriving the system of said pre-determined stimulus while injecting the conditioned alternating signal into the common mode terminal, and determining that the transducers are not well matched.

For example, in some embodiments, each transducer of the plurality of transducers is a MEMS microphone configured to produce the electrical signal in response to an acoustic signal impinging on the system which acoustic signal is the pre-determined stimulus. In such embodiments, depriving the system of said pre-determined stimulus includes substantially depriving the system of an acoustic signal impinging on the system while injecting the conditioned alternating signal into the common mode terminal.

Yet another embodiment includes an apparatus for testing a transducer module having a plurality of transducers, in which each transducer is configured to independently produce corresponding output signal in response to a common stimulus, and the plurality of transducers have a common-mode terminal (or "common-mode node"). Such an apparatus includes (a) a test signal generator configured to generate an alternating test signal having a test signal amplitude; (b) a signal processing circuit configured to process transducer output signals from a transducer module, the signal processing circuit having an interface including: (i) a first signal processing input terminal configured to receive a first transducer output; (ii) a second signal processing input terminal configured to receive a second transducer output; (iii) a signal processing circuit output interface configured to produce a system output signal based on the first transducer output and the second transducer output; and (iv) a test signal output terminal configured to provide the test signal from the test signal generator to the common-mode terminal of the transducer module. Such an embodiment also includes (c) a controller configured to controllably couple the test signal to the common-mode terminal of the transducer module in a test mode; and (d) an output comparator coupled to receive the system output signal and configured to produce, in the test mode, a comparator output signal indicating that the system output signal indicates a mismatch between the first transducer and the second transducer.

In some such embodiments, the apparatus is on a single integrated circuit.

In some such embodiments, the apparatus further includes the transducer, along with the test signal generator, the signal processing circuit, the controller, and the comparator on a single integrated circuit.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF ILLUSTRATIVE EMBODIMENTS

Illustrative embodiments a built-in self-test (BIST) detects broken MEMS plates (e.g., MEMS microphones, such as piezoelectric MEMS microphones) after manufacturing. This is a way to self-test the MEMS sensor by applying a signal, measuring an output, and comparing vs expectation.

Illustrative embodiments may use the following components/steps to implement a mismatch test:

Step 1: Inject conditioned clock signal onto common-mode terminal of MEMS sensor; and Step 2: Measure output of analog front-end charge-style amplifier and compare vs expectation.

A non-damaged transducer module should be balanced and the output below a threshold, signifying a pass criteria.

Some embodiments also implement a verification test to verify that the system is functioning properly, such that the mismatch test is functioning properly. Steps of a verification test include Step 3: Flip bit to force mismatch in MEMS bias circuit.

Step 4: Measure output of analog front-end charge-style amplifier and compare vs expectation. With a forced mismatch the output should be greater than a determined threshold to verify the test itself is functioning properly.

The BIST can be used during either initial product testing and/or during use in the field to find broken or unviable MEMS sensors.

The value comes in being able to test for a damaged MEMS sensor during initial test and in the field. This minimizes the potential release of bad units to the market and helps users find issues that may arise in the field. Some embodiments enable this feature by an I2C register bit so the user has control over when it may be used.

Definitions: As used in this description and the accompanying claims, the following terms shall have the meanings indicated, unless the context otherwise requires.

The term "BIST" means "Built-In Self-Test."

A "closed configuration" of a switch is a configuration in which the switch presents a low impedance to an electrical signal, and an "open configuration" of a switch is a configuration in which the switch presents a high impedance to an electrical signal. The impedance of a switch in its open configuration is higher than the impedance of the switch in its closed configuration. A switch may be a transistor, such as a Field Effect Transistor, or a MEMS switch, to name but a few examples.

A "common" input stimulus is a stimulus, which stimulus is provided to each transducer of a plurality of transducers.

The term "MEMS" means "micro electro-mechanical systems."

A "set" includes at least one member.

The term "well matched," in reference to two transducers, means that the response, of each of the two transducers, to a stimulus commonly applied to each of the two transducers, meets a predetermined threshold (which may be referred-to as a "mismatch" threshold). In some embodiments, the predetermined threshold may be established by a system specification pursuant to the application for which a transducer system is designed. In some embodiments, the predetermined threshold may be specified as an amplitude of the response of the two transducers to a commonly applied stimulus, such as a test signal applied to common mode terminal as described herein. In some embodiments, the predetermined threshold may be specified as a percentage of mismatch between an output signal produces by a first transducer and an output signal produced by a second transducer, in response to the same commonly applied stimulus. For example, in some embodiments, a mismatch threshold of 10 percent (10%) indicates an unacceptable mismatch between a first transducer 111 and a second transducer 112 (i.e., the transducers 111 and 112 are not well matched). In other embodiments the mismatch threshold may be twenty percent (20%), twenty five percent (25%), or thirty percent (30%), to name but a few examples.

In some embodiments, the mismatch threshold is specified as a percentage of the amplitude of the test signal. For example, in some embodiments, the pre-determined mismatch threshold is 10 percent (10%) of the injected amplitude of a conditioned alternating signal. In other embodiments the mismatch threshold may be twenty percent (20%), twenty five percent (25%), or thirty percent (30%) of the injected amplitude of a conditioned alternating signal, to name but a few examples.

In some embodiments, the system output signal is applied to a window comparator having a window, and the transducers 111, 112 are deemed to be well matched if the system output signal has an amplitude that is within the window of the window comparator, and the transducers 111, 112 are deemed to be not well matched if the system output signal has an amplitude that is not within the window of the window comparator.

In such embodiments, the mismatch threshold is defined by the upper and lower bounds (e.g., upper and lower voltage references) of the window.

Figure 1:
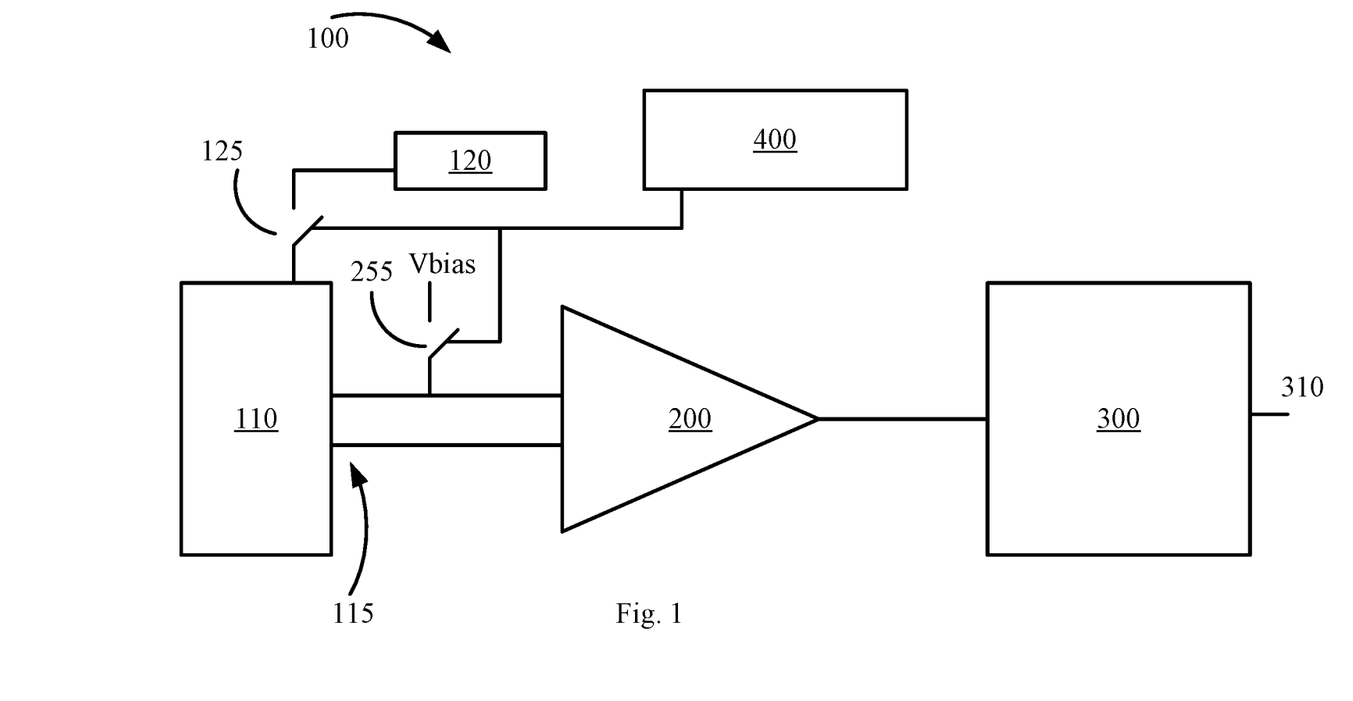
FIG. 1 schematically illustrates an embodiment of a transducer system.

FIG. 1 schematically illustrates an embodiment of a transducer system 100.

The transducer system 100 includes a transducer module 110. The transducer module 110 includes a plurality of transducers 111, 112, and produces a set of transducer output signals on a transducer output interface 115. In illustrative embodiments, each transducer 111, 112 of the plurality of transducers is a MEMS transducer.

Each transducer 111, 112 of the plurality of transducers is configured to independently produce a corresponding output signal, relative to a common-mode terminal 113, in response to a common input stimulus. In some embodiments, each transducer 111, 112 of the plurality of transducers is a capacitive transducer that has a capacitance that varies in response to a stimulus applied to the transducer. For example, some types of capacitive transducer use such a variable capacitance to convert a mechanical movement into an electrical signal. In some embodiments, each transducer 111, 112 of the plurality of transducers is a microphone. The microphone may be an electret microphone or a piezoelectric microphone, to name but a few examples. In some embodiments, each transducer 111, 112 of the plurality of transducers is an accelerometer. In some embodiments, each transducer 111, 112 of the plurality of transducers is a gyroscope.

The transducer module 110 includes a transducer output interface 115. In illustrative embodiments, the transducer output interface 115 includes a positive output terminal 117 and a negative output terminal 116. In illustrative embodiments, the transducer module 110 produces a differential transducer output signal, with one portion of the differential transducer output signal on the positive output terminal 117 and another portion of the differential transducer output signal on the negative output terminal 116.

The system 100 also includes a signal processing circuit 200 configured to couple to the transducer output interface 115 and to produce a system output signal at a system output terminal 244. In some embodiments, the signal processing circuit 200 has a linear transfer function in response to the transducer output signal. In preferred embodiments, the signal processing circuit 200 and has a high common mode rejection ratio ("CMRR"), for example at least 100 dB, as with several models of operational amplifier available from Analog Devices, Inc., for example.

Ideally, the transducers 111, 112 of the plurality of transducers are well matched, in that each such transducer will produce a very similar output in response to a commonly-applied input stimulus. It is known in the art that, sometimes, one or more transducers 111, 112 of such a plurality of transducers is, or becomes, defective, such that the plurality of transducers are mismatched.

Illustrative embodiments are configurable into a "mismatch test" mode, in which the system 100 can test the transducers 111, 112 of a transducer module to determine whether the transducers 111, 112 are well matched, and/or to determine whether the transducers 111, 112 are mismatched. Such a test may be referred-to as "mismatch test."

To that end, the system 100 includes a test signal generator 120. The test signal generator 120 is configured to produce a test signal. In illustrative embodiments, the test signal is an alternating signal, such as a square wave, having a test amplitude.

The system 100 is configured, in the test mode, to provide the test signal to the common-mode terminal 113. Each transducer 111, 112 of the plurality of transducers responds to the test signal, and produces a corresponding output signal at the transducer output interface 115.

Each such corresponding output signal includes the response of its corresponding transducer to the test signal. Such response is a common mode signal on the transducer output signal. Because the signal processing circuit 200 has a high common-mode rejection ratio, when the transducers are well-matched, the signal processing circuit output signal will include little, if any, of the test signal.

On the other hand, if the transducers are mismatched (e.g., not well-matched), the respective output signals of the transducers will be different. In that case, the signal processing circuit output signal will include a portion of the test signal. The amplitude of the portion of the test signal on the system output signal (which may be referred-to as the "mismatch amplitude") will be proportional to the mismatch of the transducers. That system output signal, produced in the test mode, may be compared to a reference, and the system my determine whether the transducers are well-matched, or not well-matched. For example, the system output signal, produced in the test mode, may be provided to a comparator 300 configured to compare the system output signal to a predetermined mismatch threshold, and if the mismatch amplitude exceeds the predetermined mismatch threshold, then the system determines (and produces an output signal 310) indicating that the transducers 111, 112 are mismatched. Conversely, if the mismatch amplitude does not exceed the predetermined mismatch threshold, then the system determines (and produces an output signal 310) indicating that the transducers 111, 112 are not mismatched.

In some embodiments, the comparator 300 is a window comparator. As known in the electrical arts, some embodiments of a window comparator utilize two comparators in parallel to determine whether the amplitude of a signal (e.g., the system output signal) is between two reference voltages, the two reference voltages defining a "window." In some embodiments, if the amplitude of the signal is within the window, the output of the window comparator is high, if the amplitude of the signal is not within the window, the output of the window comparator is low. In other embodiments, if the amplitude of the signal is within the window, the output of the window comparator is low, if the amplitude of the signal is not within the window, the output of the window comparator is high. In some embodiments, the comparator is a digital comparator, including an analog-to-digital converter to digitize the signal and provide the digitized signal to a computer processor (e.g., controller 400) to compare the digitized signal to a threshold.

Illustrative embodiments include a controller 400. The controller is configured to control the system 100 into the test mode by controllably providing the test signal to the common mode terminal 113 of the transducer module 110. In the test mode, the system is configured to execute a mismatch test.

To that end, in some embodiments, the system 100 includes a test mode switch 125 in control communication with the controller 400. In test mode, the controller 400 controls the test mode switch 125 into a closed configuration, thereby providing the test signal from the test signal generator 120 to the common mode terminal 113 of the transducer module 110. In an operational mode, the controller controls the test mode switch 125 into an open configuration, thereby withholding the test signal from the test signal generator 120 to the common mode terminal 113 of the transducer module 110.

Some embodiments are further configurable into a verification mode. In the verification mode, the system 100 is configured to execute a verification test to determine whether the mismatch test is functioning properly. Some embodiments execute a verification test sequentially (e.g., before and/or after) with a mismatch test.

To that end, such embodiments include a verification switch 225 in control communication with the controller 400. The verification switch 225 is electrically coupled between a voltage source, such as a system bias voltage source, and one terminal of a differential input of the signal processing circuit 200. In verification mode, the controller controls the verification switch 225 into a closed configuration so that the voltage source is electrically coupled to said one terminal of the differential input of the signal processing circuit 200, but not connected to the other terminal of the differential input to the signal processing circuit 200. As a consequence, the input to the signal processing circuit 200 includes the transducer output signal, plus a voltage supplied by the voltage source, which voltage supplied by the voltage source is not a common mode voltage. Consequently, the signal processing circuit output signal includes a version of the voltage supplied by the voltage source. Then, the system performs a mismatch test, as described above. If the system is functioning correctly, such that the mismatch test is operating properly, the presence of a portion of the voltage signal causes the system 100 to respond as it would when there is a transducer mismatch among the plurality of transducers 111, 112 in the transducer module 100. If the system fails to indicate a transducer mismatch among the plurality of transducers 111, 112 in the transducer module 100, that indicates that the mismatch test is not functioning, which indicates a malfunction of the system 100.

In other words, in illustrative embodiments the verification test forces the signal input to the signal processing circuit 200 to have an element that is not common mode, thereby forcing a signal that appears to the system to be the result of (e.g., causes the system to react as if there is) a transducer mismatch among the plurality of transducers 111, 112 in the transducer module 100.

As described above, and summarized in Table 1, when the switch 125 is in its closed configuration (and switch 255 is in its open configuration, the system 100 may be said to be in a "test" configuration, and when the switch 125 is in its closed configuration, and switch 255 is in its closed configuration, the system 100 may be said to be in a "verification" configuration. In some embodiments, the controller 400 may have a digital register 410 including a binary Controller Bit T 411, which may be alternately controlled to have a value of 1 or 0, and binary Controller Bit V 412, which may be alternately controlled to have a value of 1 or 0. The configuration of those bits operably control switches 125 and 225, respectively, and the value of those bits controls the mode of the system 100 according to the following Table 1:

TABLE 1

| Controller Bit T | Configuration of Switch 125 | Controller Bit V | Configuration of Switch 255 | System Configuration |
|---|---|---|---|---|
| 0 | Open | 0 | Open | Operational Mode |
| 1 | Closed | 0 | Open | Test Mode |
| 1 | Closed | 1 | Closed | Verification Mode |
| 0 | Open | 1 | Closed | Undefined |

Several embodiments of such a system are described below and illustrated in the figures.

Among other things, some illustrative embodiments include a clock and signal generator to inject a signal onto the common-mode terminal (Vcm) 113 of the transducer module 110 device as well as bias resistors that are used to provide a DC bias to an amplifier 240 (e.g., a front-end charge amplifier) and a known mismatch when a BIST controller Bit V (412) bit is high.

The clock may be generated from an on-chip oscillator to produce the desired frequency for the input signal. The signal generator is used to condition the oscillator and provide a Vclk signal of the necessary peak-to-peak amplitude and DC offset to be within the existing working limits. The Rbias_p 251 and Rbias_n 261 bias resistors under typical use are approximately 1 Tohm in value and are used to provide a DC path to bias the amplifier.

When the BIST feature is enabled (Bit T, register 411), the system is configured to execute a test (which may be referred-to as a "mismatch" test, embodiment of which is described in connection with FIG. 6) to determine whether transducers 111, 112, of the transducer module 110 are matched, or whether they are mismatched. To that end, the clock and signal generator are turned on and apply a signal to the common mode terminal (which may also be referred-to as the Vcm pin) 113 of the transducer module 110 sensor. The amplifier output Vout 244 is then assessed (e.g., by comparator 300) to determine if the capacitances Cmp 112 and Cmn 112 are matched. If they match well, and the amplifier 240 has good common-mode rejection (e.g., at least 100 dB), then very little to no signal will be seen on Vout 244. If the transducer module 110 is damaged, giving a large capacitive difference between Cmp 111 and Cmn 112 then a signal at output terminal 244 will be relatively larger. This signal will be at a frequency of Vclk with amplitude proportional to the amplitude of Vclk and the difference between Cmp 112 and Cmn 111.

$$\frac{Vout}{Vcm} = \frac{Cmp - Cmn}{Cmp - Cf}$$

A fail threshold can be set and if a signal larger than the threshold is seen then the MEMS is determined to be damaged.

If the MEMS passes this initial test, a second test (which may be referred-to as a "verification" test, an embodiment of which is described in connection with FIG. 7) may also be performed to assess whether the mismatch test was functioning properly. This may be important because the pass criteria of the mismatch test is that little to no signal is measured. This could potentially happen even if the transducers 111 and 112 are mismatched, if the test itself is not working for some reason, such as if no test signal was injected into the Vcm pin 113. In some embodiments, the verification test is done by setting a register bit=1 (e.g., Bit. V in register 412 of, in a controller 400) which shorts out Rbias_p 251 and forces Vinp (e.g., at transducer output terminal 117) to Vbias. Essentially this forces a large offset between Vinp and Vinn (e.g., at transducer output terminal 116) when the test signal (Vclk) is applied to common mode terminal 113, which offset can be detected on Vout at terminal 244. In this mode (i.e., verification mode) a pass criterion is when Vout is measured at the clock frequency with amplitude larger than a given threshold, determined by the amplitude of Vclk and the closed loop gain of the amplifier, following the transfer function below.

$$\frac{Vout}{Vcm} = \frac{Cmn}{Cf}$$

Figure 2:
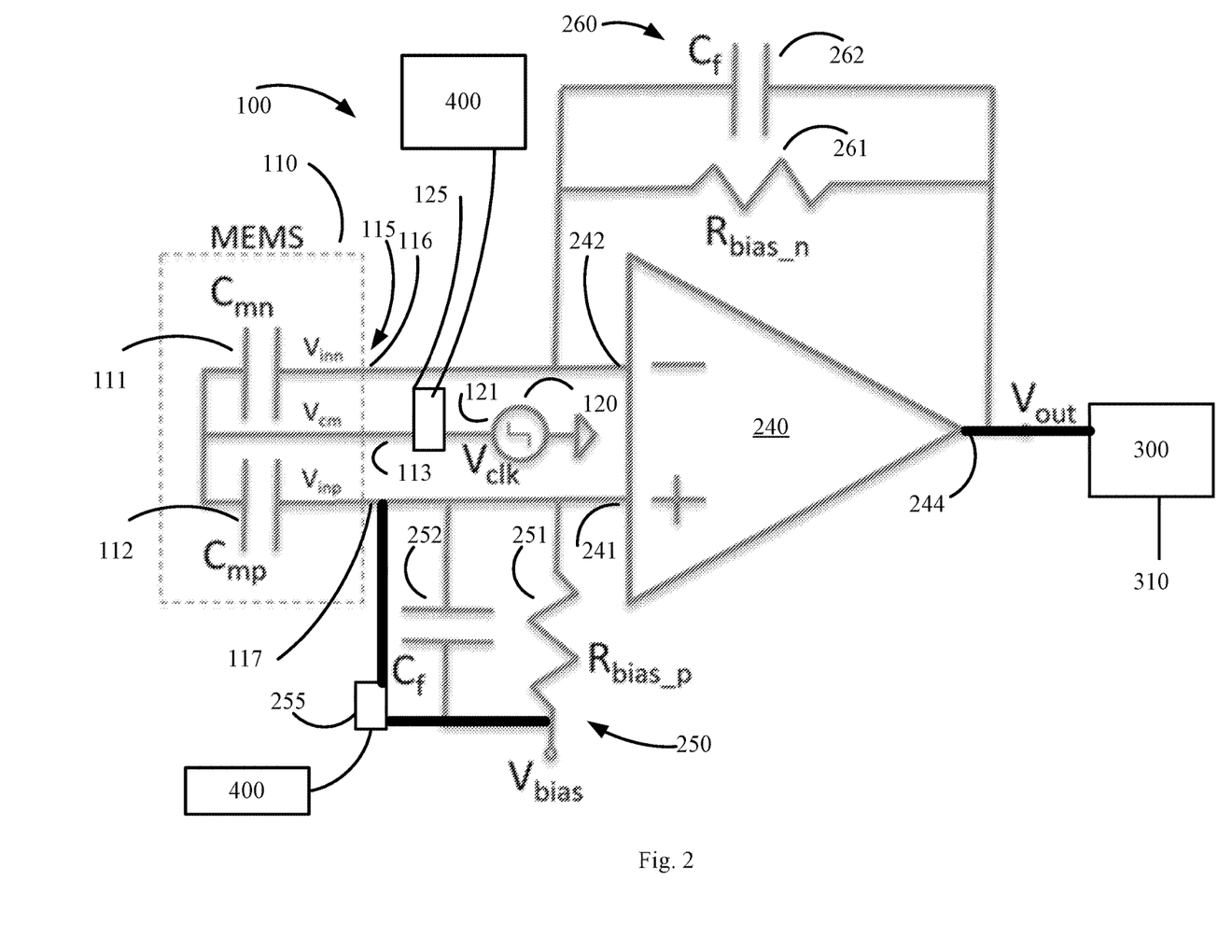
FIG. 2 schematically illustrates an embodiment of a transducer system in a single-ended amplifier configuration.

FIG. 2 schematically illustrates an embodiment of a transducer system 100 in a single-ended amplifier configuration.

The transducer system 100 includes a transducer module 110 having two transducers 111, 112. In some embodiments, the transducers 111 and 112 may be capacitive transducers, and may be referred to by their capacitances, Cmn and Cmp, respectively.

Each transducer 111 and 112 produces, in response to an applied stimulus signal, a transducer output signal relative to a voltage on common mode terminal 113. For example, in embodiments in which the transducer module 110 is a microphone, the transducers 111 and 112 are microphone transducers, and each produces a corresponding output signal in response to an acoustic stimulus signal applied to the transducer module.

The common mode terminal 113 is controllably coupled to test signal generator 120 via switch 125. The switch 125 is controllably configurable, under control of controller 400, into an open configuration (in which a test signal from test signal generator 120 is withheld from the transducer module 110) and alternately into a closed configuration (in which a test signal from test signal generator 120 is electrically coupled to and provided to the common mode terminal 113 of the transducer module). When the switch 125 is in the open configuration, the system 100 may be described as being in an "operational" configuration in which the amplifier 240 operates to produce, at output terminal 244, a version of the signal at input interface 243 (i.e., terminals 241 and 242).

When the switch 125 is in its closed configuration (and switch 255 is in its open configuration, the system 100 may be said to be in a "test" configuration. When the switch 125 is in its closed configuration, and switch 255 is in its closed configuration, the system 100 may be said to be in a "verification" configuration.

Amplifier 240 has an amplifier input interface 243 including inverting terminal 242 and non-inverting terminal 241. The amplifier interface 243 is operably coupled to the transducer interface 115, with the inverting terminal 242 operably coupled to transducer terminal 116 and the non-inverting terminal operably coupled to transducer terminal 117.

Amplifier 240 is configured in a single-ended configuration with negative feedback via first negative feedback network 260. In the embodiment of FIG. 2, the amplifier is configured as a charge amplifier with the first feedback network 260 having a first negative feedback capacitor 262 and first negative feedback resistor (which may be referred-to as a "bias" resistor, or "Rbias_n") 261.

In operational mode, the amplifier processes an output signal from transducer module 110.

In test mode, the test signal from test signal generator 120 is coupled through switch 125 to the common mode terminal 113 of the transducer module 110, and the output of amplifier 240 at terminal 244 may be compared to a threshold by comparator 300 to determine qualitatively whether the transducers 111 and 112 are mismatched, and quantitatively a degree to which transducers 111 and 112 are mismatched.

Figure 3:
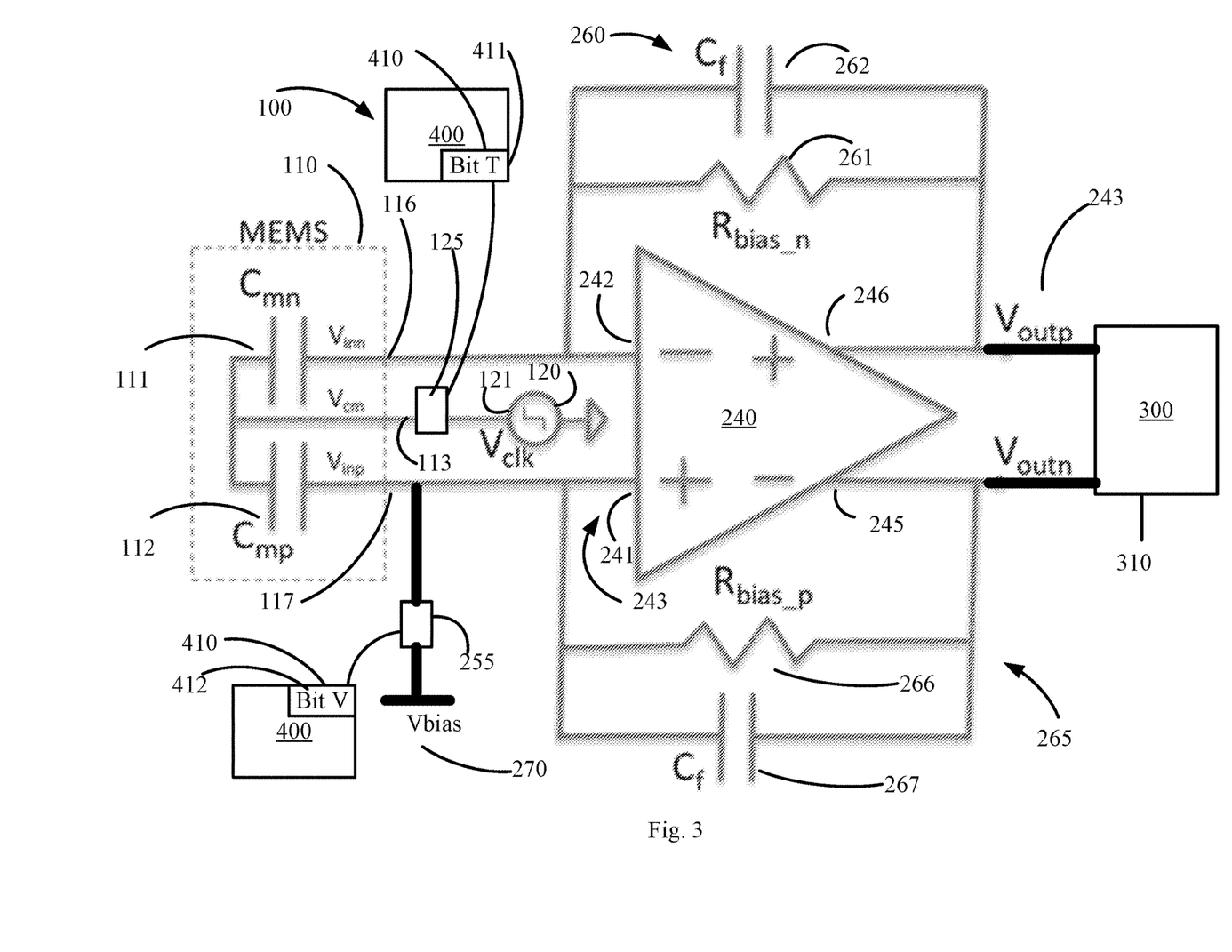
FIG. 3 schematically illustrates an embodiment of a transducer system in a differential amplifier configuration.

FIG. 3 schematically illustrates an embodiment of a transducer system 100 in a differential amplifier configuration.

In the embodiment of FIG. 3, the transducer differential output interface 115 is operably coupled to the input interface 243 of amplifier 240. Amplifier 240 is configured with first negative feedback network 260, and also with a second negative feedback network 265. In the embodiment of FIG. 3, the second negative feedback network 265 includes a second negative feedback capacitor 267 and second negative feedback resistor (which may be referred-to as another "bias" resistor, or "Rbias_p") 266.

In operational mode, the amplifier 240 processes an output signal from transducer module 110.

In test mode, the test signal from test signal generator 120 is coupled through switch 125 to the common mode terminal 113 of the transducer module 110, and the output of amplifier 240 at amplifier output interface 244 may be compared to a threshold by comparator 300 to determine qualitatively whether the transducers 111 and 112 are mismatched, and quantitatively a degree to which transducers 111 and 112 are mismatched.

Figure 4:
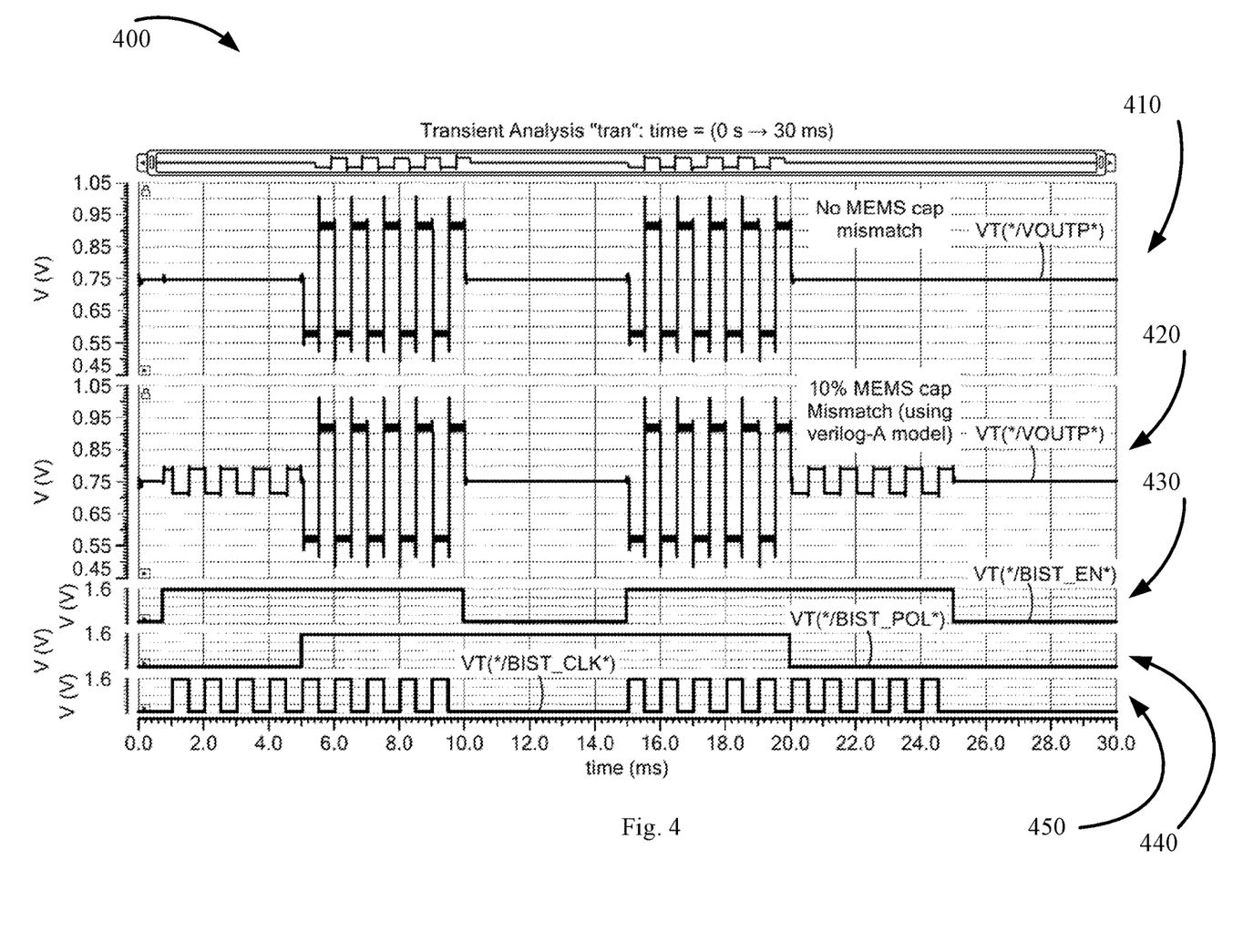
FIG. 4 schematically illustrates waveforms of certain signals within a self-test system.

FIG. 4 schematically illustrates waveforms of certain signals within a self-test system.

The following simulation results 400 show the BIST function over process, voltage, and temperature (PVT) corners. The top waveform 410 of FIG. 4 shows the amplifier output (Vout) in single-ended mode (e.g., FIG. 2) when no mismatch is present between Cmp (112) and Cmn (111).

The second waveform 420 shows Vout with a 10% mismatch between Cmp (112) and Cmn (111).

The third waveform 430 down is the digital BIST enable bit (Bit T in register 411; a signal from controller 400 to control the system 100 into test mode). In illustrative embodiments, that signal cause a switch 125 to couple a test signal from test signal generator 120 to the common mode terminal 113 of transducer module 110.

The fourth waveform 440 is the digital BIST polarity bit (Bit T in register 411; a signal from controller 400 to control the system 100 into a validation mode). In illustrative embodiments, that signal causes a switch 225 to short out Rbias_p 251 and cause a signal to be seen on the output interface 115 (e.g., terminals 116 and 117), and the bottom waveform 450 is the clock input to the signal generator 120.

As can be seen in the plot 400, when test mode (i.e., the BIST) is enabled (e.g., test mode) and the Bit V bit is low (e.g., when the system 100 is not in validation mode), no signal is seen on Vout 244 when there is no capacitance mismatch in the MEMS 111, 112 (top waveform, 310), but a signal at the BIST clock frequency (420) is seen when capacitance mismatch is present in the transducer module 110. When the test mode is enabled, and the polarity bit is set high (e.g., the system is in validation mode; Bit V=1) then a large signal is present on Vout 244 due to Rbias_p 251 being shorted to Vbias source 270.

Figure 5:
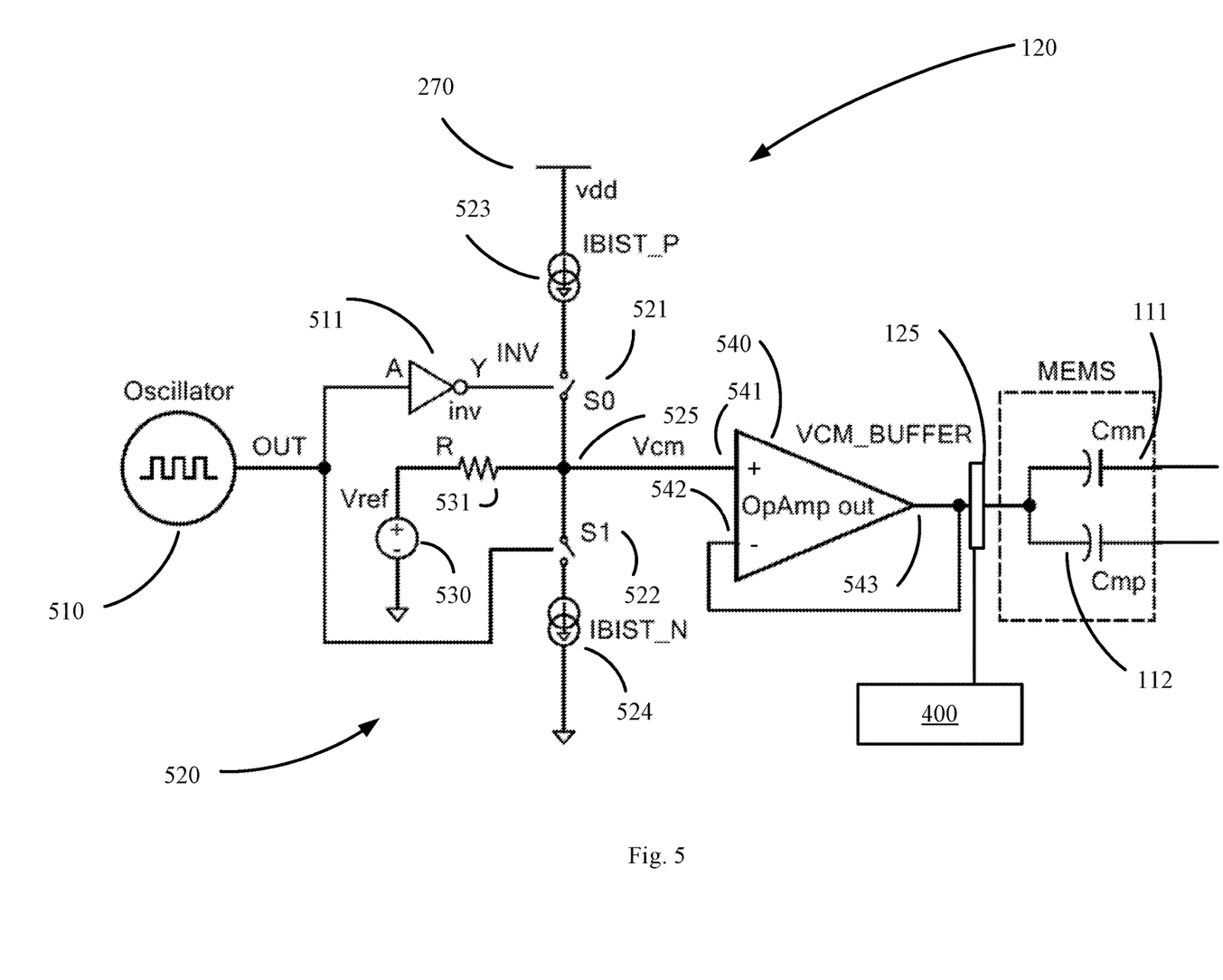
FIG. 5 schematically illustrates an embodiment of a transducer system including a signal generator.

FIG. 5 schematically illustrates an embodiment of a transducer system including a signal generator.

Among other things, illustrative embodiments include a clock 510 and signal generator 520 to inject a signal (a test signal) onto the common-mode terminal (Vcm) 113 of the transducer module 110. Some embodiments also include bias resistors that are used to provide a DC bias to the front-end charge amplifier and a known mismatch when a BIST polarity register bit is high (e.g., when the system 100 is in verification mode).

Starting from the left, first there is an oscillator (or "clock") 510 that is used to generate the desired test signal frequency. This clock is used to alternatingly toggle switches 521 ("S0") and 522 ("S1") on and off which sources or sinks current from IBIST_P 523 and IBIST_N 524 onto the Vcm node 113. To that end, the clock signal produced by oscillator 510 is provided to one switch (e.g., switch 522), and an inverted version of the clock signal is provided to the other switch (e.g., switch 521) via inverter 511.

This generates a square wave test signal on the Vcm node 113 when switch 125 is in a closed configuration. The square wave has a peak-to-peak amplitude equal to (IBIST_P+IBIST_N)*R, where "R" is the resistance of resistor 531, and "IBIST_P" is the current from current source 523, and "IBIST_N" is the current from current source 524. This waveform is centered around the value Vref, which represents the normal common-mode voltage applied to the MEMS, as provided bias voltage source 530.

The Vcm voltage at node 525 is then buffered by the VCM_BUFFER 540 before being controllably applied through switch 125 to the common mode terminal 113 of the MEMS transducer module 110. Once applied to the common mode terminal 113 of the MEMS transducer module 110, the output amplitude of the Front-End-Amplifier 240 will be proportional to the amount of the capacitance mismatch between the transducers 111 and 112, the with a frequency equal to the frequency of the test signal.

Figure 6:
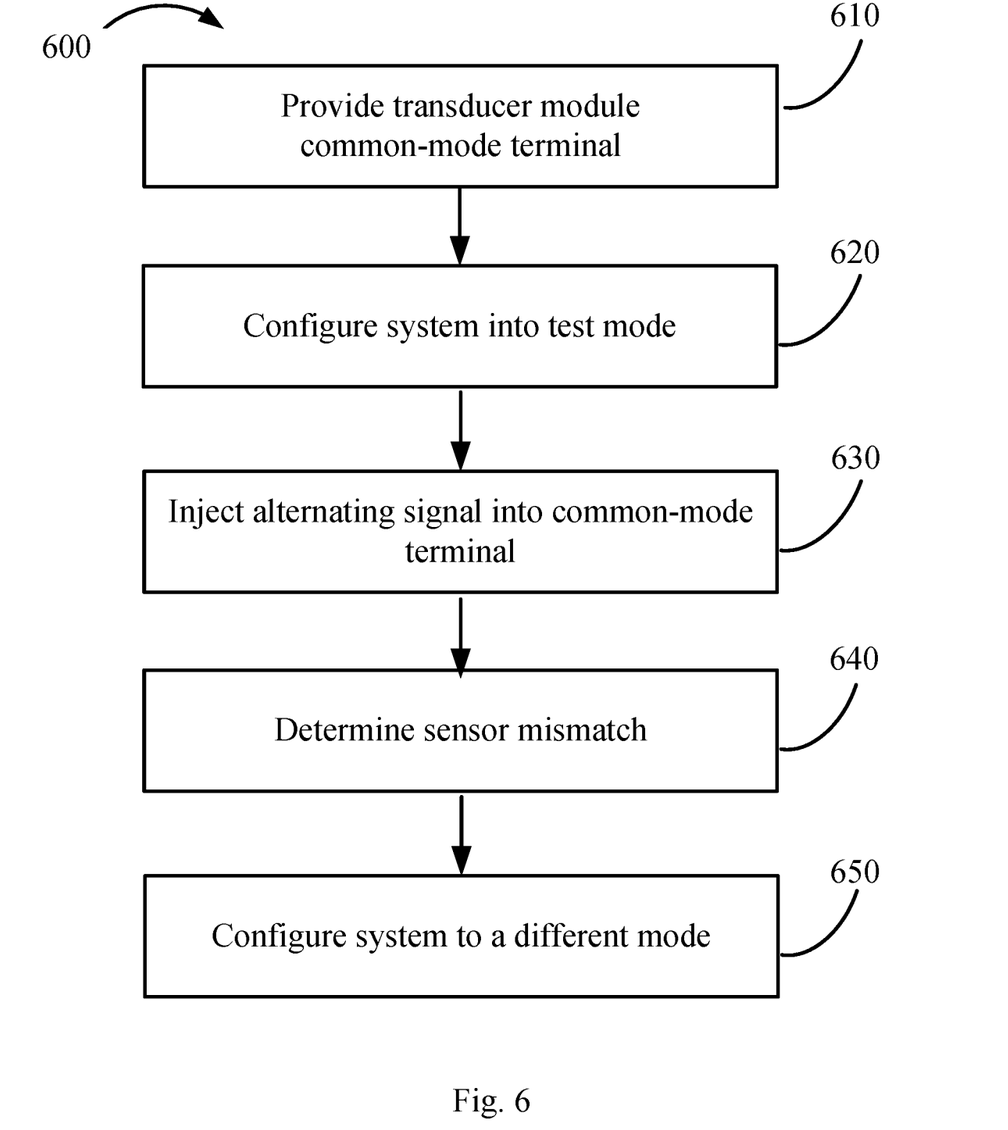
FIG. 6 is a flowchart illustrating an embodiment of a method of testing a transducer module.

FIG. 6 is a flowchart illustrating an embodiment of a method 600 of testing a transducer module 110.

Step 610 includes providing a system 100 to test a transducer module 110. The transducer module 110 includes (a) a plurality of transducers 111, 112 having a common-mode terminal 113, each transducer 111, 112 configured to independently produce corresponding output signal, relative to the common-mode terminal 113, in response to a commonly-applied stimulus. The transducer module 110 also includes a transducer output interface 115 including a plurality of transducer output terminals 116, 117, each transducer output terminal 116, 117 corresponding to a one of the plurality of transducers 111, 112, and configured to provide corresponding output signal. The transducer module 111 also includes a transducer signal amplifier input interface 243, including a plurality of amplifier input terminals 241, 242. Each amplifier input terminal 241, 242 of the plurality of amplifier input terminals operably coupled to a corresponding one of the transducer output terminals 116, 117, and a transducer signal amplifier output interface 244 configured to provide a transducer signal amplifier output signal having an amplifier output amplitude.

At step 620, the method 600 includes configuring the system into a test mode. See, e.g., Table 1.

Step 630 includes injecting a conditioned alternating signal into the common mode terminal 113. The conditioned alternating signal is an electrical signal having an amplitude which may be referred-to as its "injected" amplitude. In some embodiments, the conditioned alternating signal is a square wave.

At step 640, the method 600 further includes determining whether the transducers 111, 112 are not well matched by comparing the transducer signal amplifier output signal to a pre-determined mismatch threshold, determining that the amplifier 650 output signal exceeds the threshold or, when that is not within a window of a window comparator.

In some embodiments, determining whether the transducers are not well matched includes determining that the amplifier output amplitude exceeds the pre-determined mismatch threshold.

Some embodiments further include, at step 650 subsequent to comparing the amplifier output signal to a pre-determined mismatch threshold, configuring the system 100 into a different mode. For example, step 650 may configure the system 100 into a verification mode (see, e.g., FIG. 7), or may configure the system 100 into an operational mode (e.g., in which operational mode the system 100 is not in a test mode and is not in a verification mode).

In illustrative embodiments, step 650 includes terminating injection of the conditioned alternating signal into the common mode terminal 113.

In some embodiments, the pre-determined threshold is 10 percent (10%) of the injected amplitude of the test signal (i.e., the conditioned alternating signal).

In some embodiments, the transducer module 110 further includes an oscillator circuit 120, the oscillator circuit 120 configured to produce the test signal (i.e., conditioned alternating signal). In some such embodiments, the oscillator circuit includes 120: (i) a buffer amplifier 540 having a first buffer input terminal 541 and a second buffer input terminal 542, and a buffer output terminal 543, the buffer output terminal 543 in electrical communication with the common mode terminal 113 of the transducer module 110, and (ii) a first oscillator branch including a first switch (521) controllable into an open configuration and a closed configuration, the first switch 521 electrically coupled between a first voltage source 270 providing a first voltage, and the first buffer input terminal 541; and (iii) a second oscillator branch including a second switch 522 controllable into an open configuration and a closed configuration, the second switch electrically coupled between a second voltage source (e.g., a ground) and the second buffer input terminal 543, the second voltage source providing a second voltage that is less than the first voltage. Such embodiments also include a controller circuit 400 configured to: (1) alternately close the first switch 521 to couple the first voltage source and the first buffer input terminal 541 and to open the first switch to isolate the first voltage source 270 from the first buffer input terminal 541; and (2) alternately open the second switch 522 to isolate the second voltage source from the first buffer input terminal 541 and close the second switch 522 to couple the second voltage source to the first buffer input terminal, such that the first voltage source and the second voltage source are not simultaneously coupled to the first buffer input terminal 541.

In some embodiments, the first oscillator branch induces a first current source 523 electrically coupled between the first voltage source 270 and the first buffer input terminal 541, and the second oscillator branch includes a second current source 524 electrically coupled between the second (e.g., ground) and the first buffer input terminal 541. Illustrative embodiments also include a bias voltage source 530 in electrical communication with a node 525 defined by the first buffer input terminal 531, and the first oscillator branch and the second oscillator branch. Some illustrative embodiments also include a bias resistor 530 electrically coupled between the bias voltage source 530 and the node 525.

In some embodiments, the plurality of transducers 111, 112 include a first capacitive transducer (e.g., Cmn) having a first transducer capacitance and a second capacitive transducer (e.g., Cmp) having a second transducer capacitance; and the amplitude of the amplifier output signal, while the conditioned alternating signal is injected into the common mode terminal, is proportional to the difference between the first capacitance and the second capacitance.

In some embodiments, the amplifier 240 includes a charge amplifier.

In some embodiments, the plurality of amplifier input terminals include an inverting input terminal 242 and a non-inverting input terminal 242, and the charge amplifier 240 is configured in a single-ended configuration with a first feedback network 260 coupled to the inverting terminal 242, and a bias resistor 251 electrically coupled between a bias voltage source 270 and the non-inverting terminal 241. In some such embodiments, the system further includes a switch electrically coupled in parallel with the bias resistor, the switch 155 controllably configurable into an open configuration and a closed configuration, and the method further includes: (x) controlling the switch into a closed position to couple the bias voltage source 270 to the non-inverting terminal; and (y) determining that the method for testing a system is functioning correctly by comparing the amplifier output signal to a pre-determined verification threshold and determining that the amplifier output signal exceeds the pre-determined verification threshold.

In some embodiments of the method, the plurality of amplifier input terminals include an inverting input terminal 242 and a non-inverting input terminal 241, and a first transducer output 116 is coupled to the inverting terminal 242, and a second transducer output is coupled to the non-inverting terminal, and the charge amplifier 240 is configured in a differential mode with: a first feedback network 260 electrically coupled between the amplifier output 244 and the inverting terminal 242; and a second feedback network 250 electrically coupled between the amplifier output 244 and the non-inverting terminal 241. The system 100 also includes a bias resistor 251 electrically coupled between a bias voltage source 270 and the non-inverting terminal 241. The system also includes: a verification switch 255 electrically coupled in parallel with the bias resistor 251, the verification switch controllably configurable into an open configuration and a closed configuration. In such embodiments, the method further includes: in a verification mode, controlling the verification switch 255 into a closed position to couple the bias voltage source 270 to the non-inverting terminal 241; and determining that the method for testing a system is functioning correctly by comparing the amplifier output signal to a pre-determined verification threshold and determining that the amplifier output signal exceeds the pre-determined verification threshold.

In some embodiments of the method 600, the transducer module 110 is configured to produce an electrical signal in response to a pre-determined stimulus, and step 630 further includes depriving the transducer module 110 of said pre-determined stimulus while injecting the conditioned alternating signal into the common mode terminal, and determining that the transducers are not well matched.

For example, in some embodiments, each transducer of the plurality of transducers is a MEMS microphone configured to produce the electrical signal in response to an acoustic signal impinging on the system which acoustic signal is the pre-determined stimulus. In such embodiments, depriving the system of said pre-determined stimulus includes substantially depriving the system of an acoustic signal impinging on the system while injecting the conditioned alternating signal into the common mode terminal.

Figure 7:
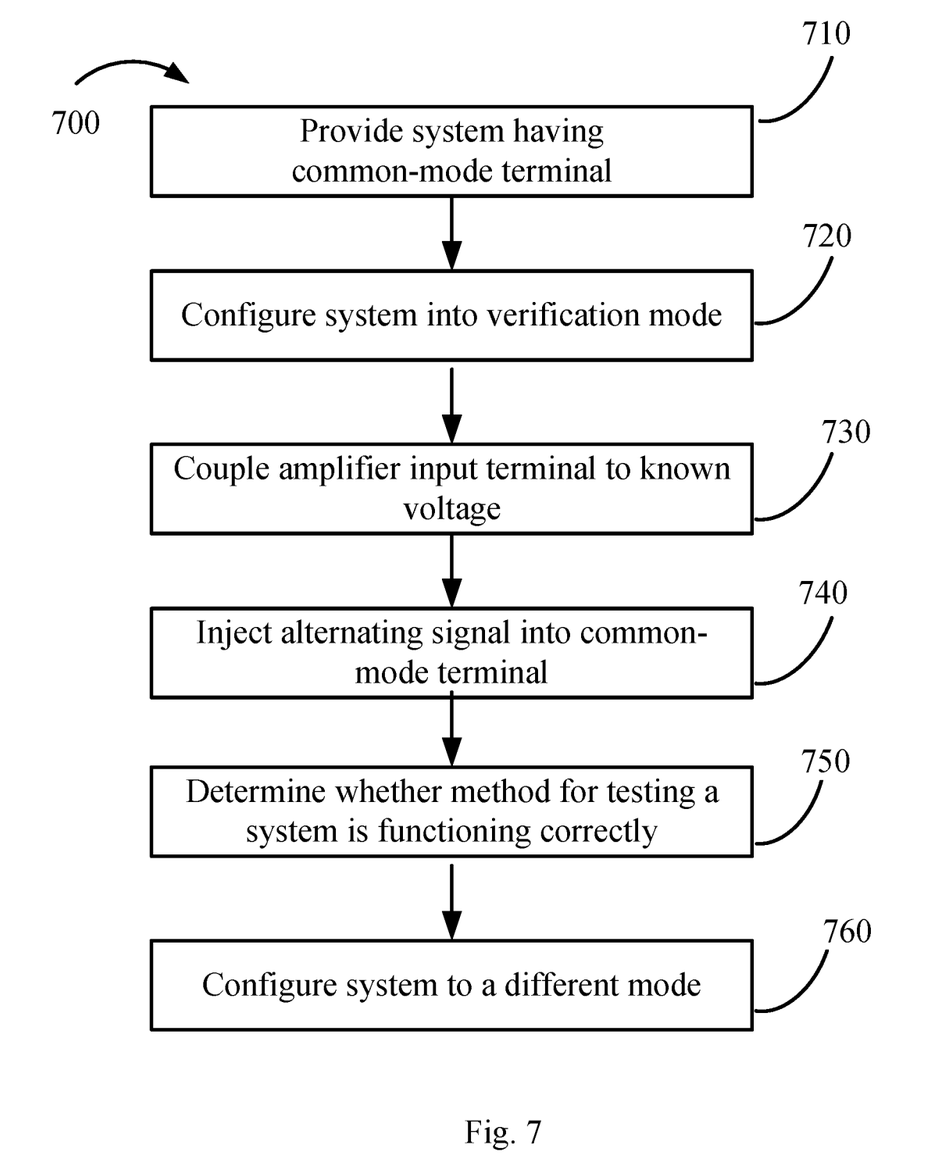
FIG. 7 is a flowchart illustrating an embodiment of a method of determining whether a method of testing a sensor system is operating properly.

FIG. 7 is a flowchart illustrating an embodiment of a method 700 of determining whether a method of testing a sensor system is operating properly.

Step 710 includes proving a system 100 for testing a transducer module 110.

Step 720 includes configuring the system into verification mode. Configuring the system into verification mode includes configuring the system 100 into (or confirm that the system 100 is already in) test mode.

Step 730 includes coupling an amplifier terminal 241 to a voltage source 270 of a known voltage, preferably a known, fixed DC voltage.

Step 740 includes injecting a test signal into a common mode terminal of a transducer module to be tested.

Step 750 includes determining whether the mismatch test is viable, and that the system is therefore working correctly. In illustrative embodiments, determining whether the mismatch test is viable includes comparing the system output signal to a viability threshold to make sure that the system output indicates a transducer mismatch that exceeds a mismatch threshold.

Step 760 includes configuring the system 100 into a different mode, such as an operational mode or a test mode.

A LISTING OF CERTAIN REFERENCE NUMBERS IS PRESENTED BELOW

100: System;
110: Transducer module;

111: First transducer;
112: Second transducer;
113: Common mode terminal (or "common node");
115: Transducer output interface;
116: First transducer output terminal;
117: Second transducer output terminal;
120: Source of alternating signal (e.g., clock signal);
121: Source output terminal;
125: Source switch;
200: Signal processing circuit;
240: Amplifier;
241: Amplifier non-inverting input terminal;
242: Amplifier inverting input terminal;
243: Amplifier input interface;
244: Amplifier output interface;
245: Differential amplifier inverting output terminal;
246: Differential amplifier non-inverting output terminal;
250: Amplifier bias network;
251: Amplifier bias resistor;
252: Amplifier bias capacitor;
255: Amplifier bias switch;
260: First amplifier negative feedback network;
261: First amplifier negative feedback resistor;
262: First amplifier negative feedback capacitor;
265: Second amplifier negative feedback network;
266: Second amplifier negative feedback resistor;
267: Second amplifier negative feedback capacitor;
270: Bias voltage source;
300: Output comparator;
400: Controller;
510: Test signal generator clock (or "oscillator");
511: Test signal generator clock inverter;
520: Signal conditioner;
521: First test signal generator switch;
522: Second test signal generator switch;
523: First test signal generator current source;
524: Second test signal generator current source;
525: Test signal generator node;
530: Test signal generator bias voltage source;
531: Test signal generator resistor;
540: Test signal buffer amplifier;
541: First test signal buffer amplifier input terminal;
542: Second test signal buffer amplifier input terminal;
543: Test signal buffer amplifier output terminal;

Various embodiments may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

P1. A method for testing a system, comprising:
providing a transducer module having:
a plurality of transducers having a common-mode terminal, each transducer configured to independently produce corresponding output signal, relative to the common-mode terminal, in response to a common stimulus, and
a transducer output interface comprising a plurality of transducer output terminals, each transducer output terminal corresponding to a one of the plurality of transducers and configured to provide corresponding output signal, and
a transducer signal amplifier input interface comprising a plurality of amplifier input terminals, each amplifier input terminal of the plurality of amplifier input terminals operably coupled to a corresponding one of the transducer output terminals, and a transducer signal amplifier output interface configured to provide a transducer signal amplifier output signal having an amplifier output amplitude;
injecting a conditioned alternating signal into the common mode terminal, the conditioned alternating signal being an electrical signal having an injected amplitude; and
determining whether the transducers are not well matched by:
comparing the transducer signal amplifier output signal to a pre-determined mismatch threshold.

P2. The method of P1, wherein determining whether the transducers are not well matched comprises determining that the transducers are not well matched by:
after comparing the amplifier output signal to a pre-determined mismatch threshold:
determining that the amplifier output amplitude exceeds the pre-determined mismatch threshold.

P3. The method of any of P1-P2, further comprising, subsequent to comparing the amplifier output signal to a pre-determined mismatch threshold, terminating injection of the conditioned alternating signal into the common mode terminal.

P4. The method of any of P1-P3, wherein the pre-determined threshold is 10 percent (10%) of the injected amplitude of the conditioned alternating signal.

P5. The method of any of P1-P4, wherein the conditioned alternating signal is a square wave.

P6. The method of any of P1-P5, wherein the transducer module further comprises an oscillator circuit, the oscillator circuit configured to produce the conditioned alternating signal.

P7. The method of P6, wherein the oscillator circuit comprises:
a buffer amplifier having a first buffer input terminal and a second buffer input terminal, and a buffer output terminal, the buffer output terminal in electrical communication with the common mode terminal;
a first oscillator branch comprising a first switch controllable into an open configuration and a closed configuration, the first switch electrically coupled between a first voltage source providing a first voltage, and the first buffer input terminal;
a second oscillator branch comprising a second switch controllable into an open configuration and a closed configuration, the second switch electrically coupled between a second voltage source and the second buffer input terminal, the second voltage source providing a second voltage that is less than the first voltage;
a controller circuit configured to:
alternately close the first switch to couple the first voltage source and the first buffer input terminal and to open the first switch to isolate the first voltage source from the first buffer input terminal; and
alternately open the second switch to isolate the second voltage source from the first buffer input terminal and close the second switch to couple the second voltage source to the first buffer input terminal, such that the first voltage source and the second voltage source are not simultaneously coupled to the first buffer input terminal.

P8. The method of any of P1-P7, wherein:
the plurality of transducers comprise a first capacitive transducer having a first transducer capacitance and a second capacitive transducer having a second transducer capacitance; and
the amplitude of the amplifier output signal, while the conditioned alternating signal is injected into the common mode terminal, is proportional to the difference between the first capacitance and the second capacitance.

P9. The method of any of P1-P8, wherein the amplifier comprises a charge amplifier.

P10. The method of P9, wherein the plurality of amplifier input terminals include an inverting input terminal and a non-inverting input terminal, and the charge amplifier is configured in a non-inverting mode with a feedback network coupled to the inverting terminal, and a bias resistor electrically coupled between a bias voltage source and the non-inverting terminal.

P11. The method of P10, wherein the system further comprises a switch electrically coupled in parallel with the bias resistor, the switch controllably configurable into an open configuration and a closed configuration, and the method further comprises:
controlling the switch into a closed position to couple the bias voltage source to the non-inverting terminal; and
determining that the method for testing a system is functioning correctly that comparing the amplifier output signal to a pre-determined verification threshold and determining that the amplifier output signal exceeds the pre-determined verification threshold.

P12. The method of P9, wherein the plurality of amplifier input terminals include an inverting input terminal and a non-inverting input terminal, and a first transducer output is coupled to the inverting terminal, and a second transducer output is coupled to the non-inverting terminal, and the charge amplifier is configured in a differential mode with:
a first feedback network electrically coupled between the amplifier output and the inverting terminal; and
a second feedback network electrically coupled between the amplifier output and the non-inverting terminal; and
a bias resistor electrically coupled between a bias voltage source and the non-inverting terminal; and the system also includes:
a verification switch electrically coupled in parallel with the bias resistor, the verification switch controllably configurable into an open configuration and a closed configuration, and the method further comprises:
in a verification mode, controlling the verification switch into a closed position to couple the bias voltage source to the non-inverting terminal; and
determining that the method for testing a system is functioning correctly by comparing the amplifier output signal to a pre-determined verification threshold and determining that the amplifier output signal exceeds the pre-determined verification threshold.

P13. The method of any of P1-P12, wherein the transducer module is configured to produce an electrical signal in response to a pre-determined stimulus, and the method further includes depriving the system of said pre-determined stimulus while injecting the conditioned alternating signal into the common mode terminal, and determining that the transducers are not well matched.

P14. The method of P13, wherein:
each transducer of the plurality of transducers is a MEMS microphone configured to produce the electrical signal in response an acoustic signal impinging on the system; and wherein
depriving the system of said pre-determined stimulus comprises substantially depriving the system of an acoustic signal impinging on the system while injecting the conditioned alternating signal into the common mode terminal.

P31. An apparatus for testing a transducer module having a plurality of transducers, each transducer configured to independently produce corresponding output signal in response to a common stimulus, the plurality of transducers having a common-mode terminal, the apparatus comprising:
a test signal generator configured to generate an alternating test signal having a test signal amplitude;
a signal processing circuit configured to process transducer output signals from a transducer module, the signal processing circuit having an interface comprising:
a first signal processing input terminal configured to receive a first transducer output;
a second signal processing input terminal configured to receive a second transducer output;
a signal processing circuit output configured to produce a system output signal based on the first transducer output and the second transducer output;
a test signal output terminal configured to provide the test signal from the test signal generator to the common-mode terminal of the transducer module;
a controller configured to controllably couple the test signal to the common-mode terminal of the transducer module in a test mode; and
an output comparator coupled to receive the system output signal and configured to produce, in the test mode, a comparator output signal indicating that the system output signal indicates a mismatch between the first transducer and the second transducer.

P32. The apparatus of P31 wherein the apparatus is on a single integrated circuit.

P33. The apparatus of any of P31-P32, wherein the apparatus further comprises the transducer.

P34. The apparatus of P33, wherein the apparatus is on a single integrated circuit.

P41. An apparatus for testing a transducer module having a first transducer and a second transducer, each of the first transducer and the second transducer configured to independently produce corresponding first and second output signal in response to a common stimulus applied to the first transducer and the second transducer, the plurality of transducers having a common-mode terminal, the means comprising:
means for generating a test signal;
means for processing transducer output signals from the transducer module to produce a transducer module output signal;
means for controllably providing the test signal to the common-mode terminal, in a test mode; and
means for producing, in the test mode, a mismatch output signal indicating that the transducer module output signal indicates a mismatch between the first transducer and the second transducer.

P42. The apparatus of P30, wherein:
the transducer module output signal has a transducer module output amplitude, and
the means for producing the mismatch output signal comprises a window comparator configured to determine whether the transducer module output amplitude is within an amplitude window, and is configured to produce the mismatch output signal when the transducer module output amplitude is not within the amplitude window.

Various embodiments of this disclosure may be implemented at least in part in any conventional computer programming language. For example, some embodiments may be implemented in a procedural programming language (e.g., "C"), or in an object-oriented programming language (e.g., "C++"), or in Python, R, Java, LISP or Prolog. Other embodiments of this disclosure may be implemented as preprogrammed hardware elements (e.g., application specific integrated circuits, FPGAs, and digital signal processors), or other related components.

In an alternative embodiment, the disclosed apparatus and methods may be implemented as a computer program product for use with a computer system. Such implementation may include a series of computer instructions fixed either on a tangible medium, such as a non-transient computer readable medium (e.g., a diskette, CD-ROM, ROM, FLASH memory, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of this disclosure may be implemented as a combination of both software (e.g., a computer program product) and hardware. Still other embodiments of this disclosure are implemented as entirely hardware, or entirely software.

Computer program logic implementing all or part of the functionality previously described herein may be executed at different times on a single processor (e.g., concurrently) or may be executed at the same or different times on multiple processors and may run under a single operating system process/thread or under different operating system processes/threads. Thus, the term "computer process" refers generally to the execution of a set of computer program instructions regardless of whether different computer processes are executed on the same or different processors and regardless of whether different computer processes run under the same operating system process/thread or different operating system processes/threads.

The embodiments described above are intended to be merely exemplary; numerous variations and modifications will be apparent to those skilled in the art. All such variations and modifications are intended to be within the scope of the present disclosure as defined in any appended claims.

What is claimed is:

1. A method for testing a system, comprising:
providing a transducer module having:
a plurality of transducers having a common-mode terminal, each transducer configured to independently produce corresponding output signal, relative to the common-mode terminal, in response to a common stimulus, and
a transducer output interface comprising a plurality of transducer output terminals, each transducer output terminal corresponding to a one of the plurality of transducers and configured to provide corresponding output signal;
providing a transducer signal amplifier input interface comprising a plurality of amplifier input terminals, each amplifier input terminal of the plurality of amplifier input terminals operably coupled to a corresponding one of the transducer output terminals, and a transducer signal amplifier output interface configured to provide a transducer signal amplifier output signal having an amplifier output amplitude;
injecting a conditioned alternating signal into the common mode terminal, the conditioned alternating signal being an electrical signal having an injected amplitude; and
determining whether the plurality of transducers are not well matched by;
comparing the transducer signal amplifier output signal to a pre-determined mismatch threshold.

2. The method of claim 1, wherein determining whether the plurality of transducers are not well matched comprises determining that the plurality of transducers are not well matched by: determining that the amplifier output amplitude exceeds the pre-determined mismatch threshold.

3. The method of claim 1, further comprising, subsequent to comparing the amplifier output signal to a pre-determined mismatch threshold, terminating injection of the conditioned alternating signal into the common mode terminal.

4. The method of claim 1, wherein the pre-determined mismatch threshold is 10 percent (10%) of the injected amplitude of the conditioned alternating signal.

5. The method of claim 1, wherein the conditioned alternating signal is a square wave.

6. The method of claim 1, wherein the transducer module further comprises an oscillator circuit, the oscillator circuit configured to produce the conditioned alternating signal.

7. The method of claim 6, wherein the oscillator circuit comprises:
a buffer amplifier having a first buffer input terminal and a second buffer input terminal, and a buffer output terminal, the buffer output terminal in electrical communication with the common mode terminal;
a first oscillator branch comprising a first switch controllable into an open configuration and a closed configuration, the first switch electrically coupled between a first voltage source providing a first voltage, and the first buffer input terminal;
a second oscillator branch comprising a second switch controllable into an open configuration and a closed configuration, the second switch electrically coupled between a second voltage source and the second buffer input terminal, the second voltage source providing a second voltage that is less than the first voltage;
a controller circuit configured to:
alternately close the first switch to couple the first voltage source and the first buffer input terminal and to open the first switch to isolate the first voltage source from the first buffer input terminal; and
alternately open the second switch to isolate the second voltage source from the first buffer input terminal and close the second switch to couple the second voltage source to the first buffer input terminal, such that the first voltage source and the second voltage source are not simultaneously coupled to the first buffer input terminal.

8. The method of claim 1, wherein:
the plurality of transducers comprise a first capacitive transducer having a first transducer capacitance and a second capacitive transducer having a second transducer capacitance; and
the amplitude of the amplifier output signal, while the conditioned alternating signal is injected into the common mode terminal, is proportional to the difference between the first capacitance and the second capacitance.

9. The method of claim 7, wherein the buffer amplifier comprises a charge amplifier.

10. The method of claim 9, wherein the plurality of amplifier input terminals include an inverting input terminal and a non-inverting input terminal, and the charge amplifier is configured in a non-inverting mode with a feedback network coupled to the inverting input terminal, and a bias resistor electrically coupled between a bias voltage source and the non-inverting input terminal.

11. The method of claim 10, wherein the system further comprises a switch electrically coupled in parallel with the bias resistor, the switch controllably configurable into an open configuration and a closed configuration, and the method further comprises: controlling the switch into a closed position to couple the bias voltage source to the non-inverting input terminal; and determining that the method for testing a system is functioning correctly that comparing the amplifier output signal to a pre-determined verification threshold and determining that the amplifier output signal exceeds the pre-determined verification threshold.

12. The method of claim 9, wherein the plurality of amplifier input terminals include an inverting input terminal and a non-inverting input terminal, and a first transducer output is coupled to the inverting input terminal, and a second transducer output is coupled to the non-inverting input terminal, and the charge amplifier is configured in a differential mode with: a first feedback network electrically coupled between the amplifier output and the inverting input terminal; and a second feedback network electrically coupled between the amplifier output and the non-inverting input terminal; and a bias resistor electrically coupled between a bias voltage source and the non-inverting input terminal; and the system also includes: a verification switch electrically coupled in parallel with the bias resistor, the verification switch controllably configurable into an open configuration and a closed configuration, and the method further comprises: in a verification mode, controlling the verification switch into a closed position to couple the bias voltage source to the non-inverting input terminal; and determining that the method for testing a system is functioning correctly by comparing the amplifier output signal to a pre-determined verification threshold and determining that the amplifier output signal exceeds the pre-determined verification threshold.

13. The method of claim 1, wherein the transducer module is configured to produce an electrical signal in response to a pre-determined stimulus, and the method further includes: depriving the system of said pre-determined stimulus while injecting the conditioned alternating signal into the common mode terminal, and determining that the plurality of transducers are not well matched.

14. The method of claim 13, wherein:
each transducer of the plurality of transducers is a MEMS microphone configured to produce the electrical signal in response an acoustic signal impinging on the system; and wherein
depriving the system of said pre-determined stimulus comprises substantially depriving the system of an acoustic signal impinging on the system while injecting the conditioned alternating signal into the common mode terminal.

15. An apparatus for testing a transducer module having a plurality of transducers, the plurality of transducers having a common-mode terminal, each transducer configured to independently produce corresponding output signal relative to the common-mode terminal in response to a common stimulus, the apparatus comprising:
a test signal generator configured to generate an alternating test signal having a test signal amplitude, the test signal generator having a test signal output terminal configured to provide the test signal from the test signal generator to the common-mode terminal of the transducer module;
a signal processing circuit configured to process transducer output signals from the transducer module, the signal processing circuit having an interface comprising:
a first signal processing input terminal configured to receive a first transducer output;
a second signal processing input terminal configured to receive a second transducer output;
a signal processing circuit output configured to produce a system output signal based on the first transducer output and the second transducer output;
a controller configured to controllably couple the test signal to the common-mode terminal of the transducer module in a test mode; and
an output comparator coupled to receive the system output signal and configured to produce, in the test mode, a comparator output signal indicating that the system output signal indicates a mismatch between the first transducer output and the second transducer output.

16. The apparatus of claim 15, wherein the apparatus is on a single integrated circuit.

* * * * *